(12) United States Patent
Ogliari et al.

(10) Patent No.: US 6,648,974 B1
(45) Date of Patent: Nov. 18, 2003

(54) DEVICE AND METHOD FOR HANDLING SUBSTRATES BY MEANS OF A SELF-LEVELING VACUUM SYSTEM IN EPITAXIAL INDUCTION

(75) Inventors: Vincenzo Ogliari, Capergnanica (IT); Vittorio Pozzetti, Brugherio (IT); Franco Preti, Milan (IT)

(73) Assignee: LPE SpA, Bollate (IT)

( * ) Notice: Subject to any disclaimer, the term of this patent is extended or adjusted under 35 U.S.C. 154(b) by 0 days.

(21) Appl. No.: 09/913,096

(22) PCT Filed: Dec. 3, 1999

(86) PCT No.: PCT/EP99/09638

§ 371 (c)(1),
(2), (4) Date: Aug. 7, 2001

(87) PCT Pub. No.: WO00/48234

PCT Pub. Date: Aug. 17, 2000

(30) Foreign Application Priority Data

Feb. 12, 1999  (IT) ........................................... MI99A0281

(51) Int. Cl.⁷ .............................................. C23C 16/00
(52) U.S. Cl. .................. 118/719; 156/345.31; 438/907; 414/941
(58) Field of Search ....................... 118/719; 414/751.1, 414/751.2, 941; 156/345.31, 345.32

(56) References Cited

U.S. PATENT DOCUMENTS

| | | | | |
|---|---|---|---|---|
| 3,223,442 A | * | 12/1965 | Fawdry et al. ............. | 294/64.1 |
| 4,129,328 A | * | 12/1978 | Littell .......................... | 294/65 |
| 4,433,951 A | * | 2/1984 | Koch et al. ................. | 414/217 |
| 4,588,343 A | * | 5/1986 | Garrett ........................ | 414/221 |
| 4,828,224 A | * | 5/1989 | Crabb et al. ................ | 251/298 |
| 4,904,012 A | * | 2/1990 | Nishiguchi et al. ........ | 294/64.1 |
| 4,915,564 A | * | 4/1990 | Eror et al. ................... | 414/217 |
| 5,172,922 A | * | 12/1992 | Kowaleski et al. .......... | 279/3 |
| 5,626,675 A | * | 5/1997 | Sakamoto et al. .......... | 118/663 |
| 5,766,360 A | * | 6/1998 | Sato et al. ................... | 118/666 |
| 5,833,288 A | * | 11/1998 | Itasaka ........................ | 294/64.1 |
| 5,843,233 A | * | 12/1998 | van de Ven et al. ........ | 118/715 |
| 5,961,169 A | * | 10/1999 | Kalenian et al. ............ | 294/64.1 |
| 5,984,619 A | * | 11/1999 | Allen et al. ................. | 414/752.1 |
| 6,066,210 A | * | 5/2000 | Yonemitsu et al. ......... | 118/719 |
| 6,517,130 B1 | * | 2/2003 | Donoso et al. .............. | 294/64.1 |

* cited by examiner

*Primary Examiner*—Parviz Hassanzadeh
*Assistant Examiner*—Karla Moore
(74) *Attorney, Agent, or Firm*—Perkins Coie LLP; Paul L. Hickman; David B. Dort

(57) ABSTRACT

A device for handling substrates, used in an epitaxial apparatus or reactor (20) for chemical vapour deposition (CVD) onto the said substrates, comprises an internal robot (30) provided with means (60) for gripping and transporting substrates, which are in the form of semiconductor slices (24), in order to transfer them from cassettes (38, 40) containing the semiconductor slices (24) to be processed, the gripping and transportation means (60) having precisely the task of transporting the slices (24), which are present in a purging chamber (34) and supplied from a cassette (38) for storage of the said slices (24), from the purging chamber (34) into a reaction chamber (22) of the epitaxial reactor (20) and, more particularly, into seats ($28_{a-e}$) formed on a flat disk-shaped susceptor (26) which is present in the reaction chamber (22) of the epitaxial reactor (20) and vice versa, from the reaction chamber (22) again passing through the purging chamber (34), to the cassettes (38, 40).

15 Claims, 6 Drawing Sheets

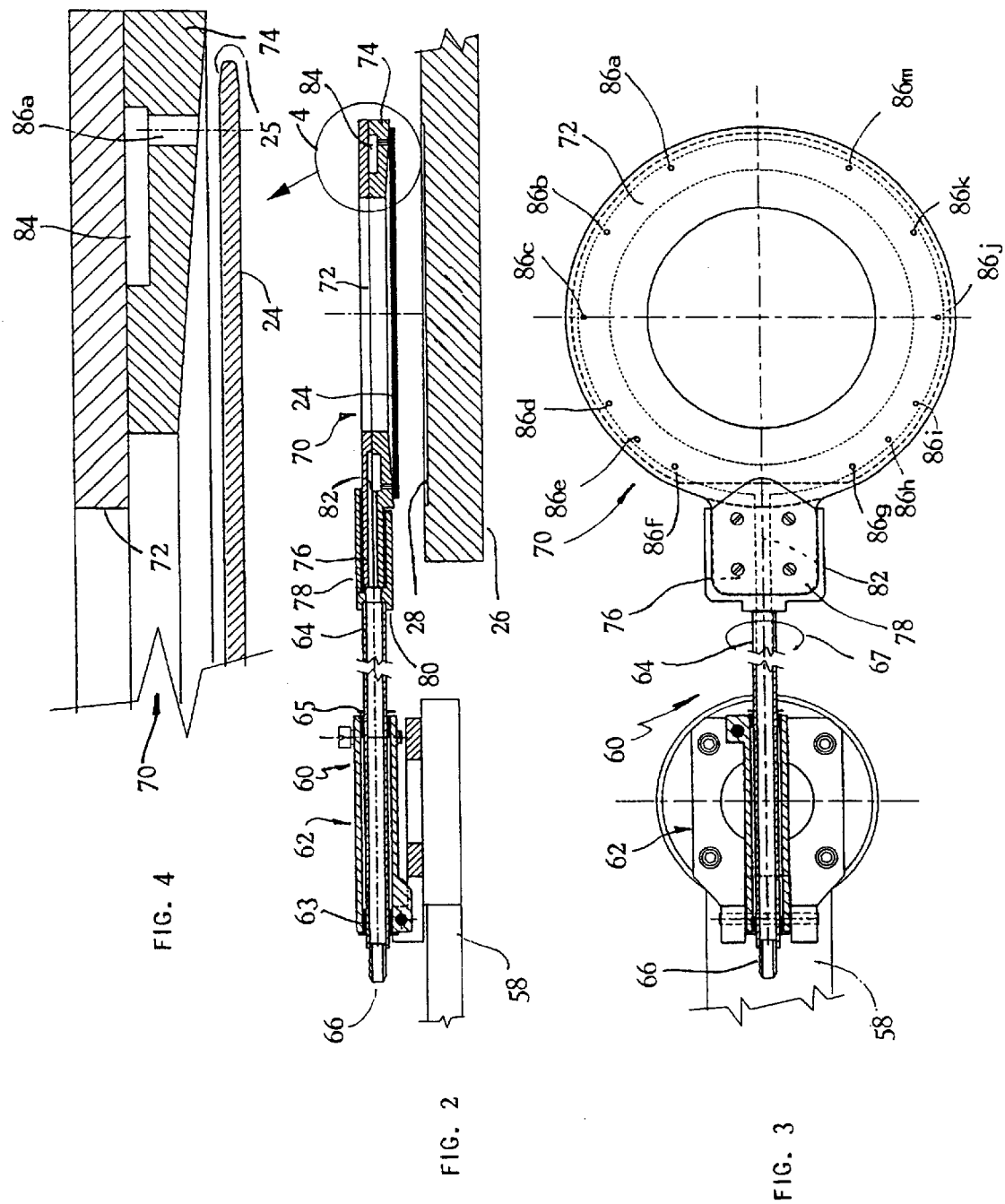

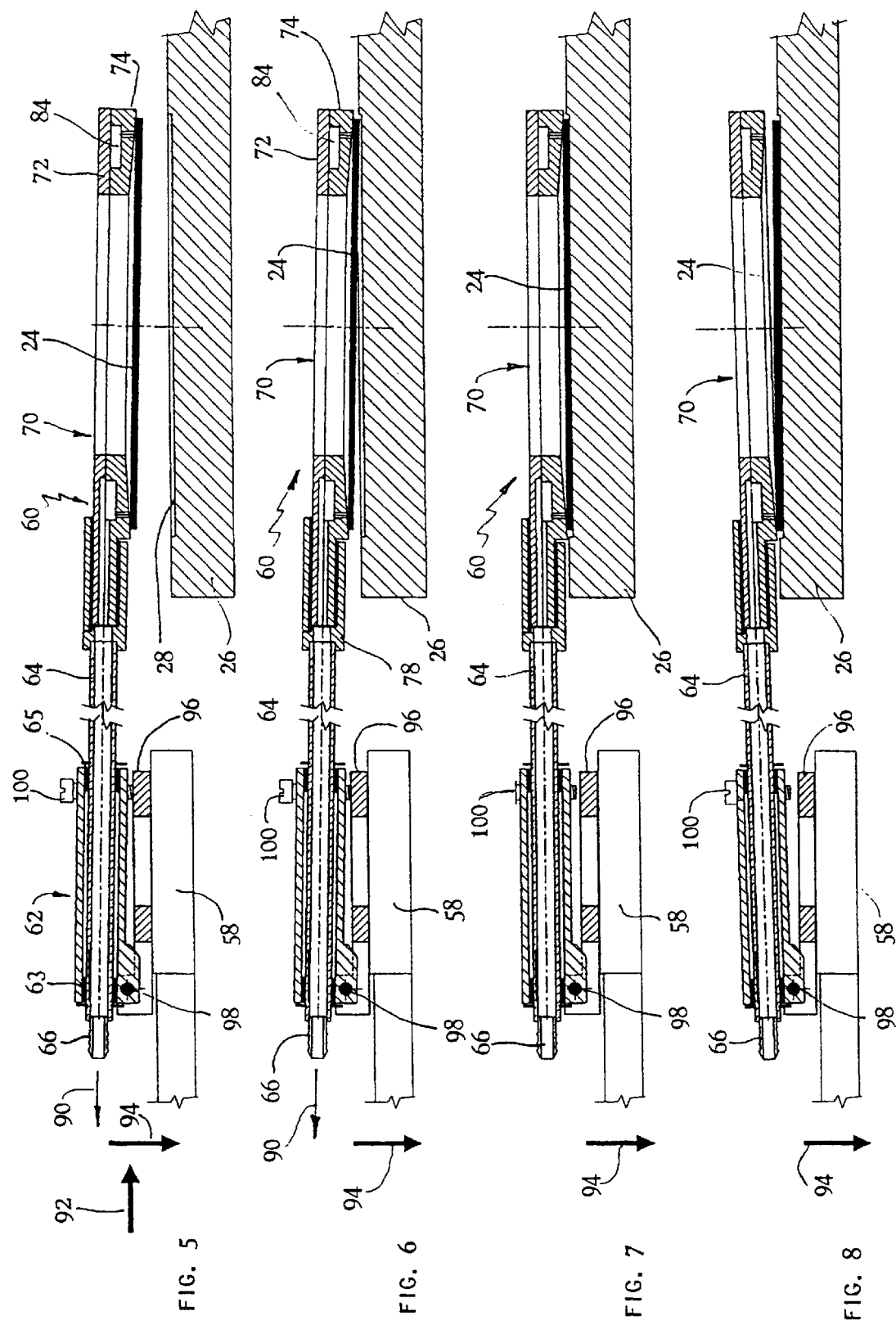

DEVICE AND METHOD FOR HANDLING SUBSTRATES BY MEANS OF A SELF-LEVELING VACUUM SYSTEM IN EPITAXIAL INDUCTION

The present invention relates to a device for handling substrates, in particular semiconductor slices, in an apparatus used for the chemical vapour deposition (CVD) of semiconductor material onto the said substrates and a method for operation of the said device. It especially relates to a device for handling substrates used in an epitaxial reactor and, in particular, relates to an epitaxial reactor for performing the chemical vapour deposition (CVD) of materials onto the said substrates, preferably silicon substrates used in the manufacture of semiconductor components, such as chips for integrated circuits.

More particularly, the present invention relates to a device used in epitaxial reactors such as those covered by the International Patent Application WO 96/10659 filed on Sep. 14, 1995, with the title "Epitaxial reactor provided with flat disk-shaped susceptor and having a gas flow parallel to the substrates". With the aid of the present device, the abovementioned epitaxial reactor becomes a reactor of the "cassette-to-cassette" type because the cassettes containing the as yet unprocessed substrates are positioned inside the reactor and, during a product loading cycle, a first mechanized arm, or robot, not forming part of the present invention, is used to transport the substrates from a storage rack or "cassette" to a purging chamber and a second mechanized arm, or robot, carrying externally a gripping and transportation means, forming the subject of the present invention, for transporting the substrates from the purging chamber to the susceptor, whereas, during an unloading cycle, the second robot transports the substrates from the susceptor to the purging chamber and subsequently the first robot transports the said substrates, which have undergone processing, from the purging chamber to one of the cassettes, all of which occurring without manual intervention of an operator supervising operation of the reactor.

The invention may be applied in particular to cold-wall CVD systems, preferably, to reactors which are able to provide epitaxial growth on substrates or silicon slices which are used in the manufacture of semiconductor devices by means of deposition involving chlorosilane vapour pyrolysis.

The commercially most widespread epitaxial reactors can be divided into two main categories:
 a) single-slice reactors, which are able to process a single slice at a time; and
 b) batch-type reactors, which are able to process a plurality of substrates or slices at the same time.

The heating systems used for the abovementioned reactors may be classified as two types: lamp-type heating systems and medium or high frequency induction heating systems.

The batch-type reactors which are most widespread on an industrial level are essentially of two types: those which use the so-called "barrel" system, i.e. with a prismatic or truncated-pyramid susceptor, and those which use the "pancake" system, with a substantially flat disk-shaped susceptor.

Typically, at present, batch-type reactors are of the manual loading type, whereas single-slice reactors are of the automatic loading type.

In automatic-loading reactors, the substrate, or slice, may be handled in different ways which offer both advantages and disadvantages. Handling of the substrates is particularly critical in the sector of semiconductors and, in particular, in epitaxial reactors where there are temperature-related problems and problems resulting from particle contamination.

Generally, each substrate or slice has a bottom side (back), a top side (front) and a side wall (edge). The dimensions of the front and back are normally between 75 and 300 mm, and even as much as 400 mm, while the dimensions of the edge are smaller than or near to 1 mm. The front is the most important part of a slice because it is the part where the chemical reaction process, i.e. deposition, takes place.

For the abovementioned reason, it is important to avoid all contact between the front and any type of tool used for handling, because any contact, even of the slightest nature, causes imperfections in the crystal lattice. If the imperfections are formed during loading, they are magnified by the ensuing heat process; however, imperfections introduced during unloading must also be avoided.

Basically, it may be stated that contact, even of an accidental nature, with the front of the slice is nor permitted at any time. On the other hand, within certain limits, contact with the back and with the edge of the said slice is permitted.

Therefore, in order to move a slice, it is possible to act via the front (without any direct contact, however), the back or the edge.

Basically, there is only one system which allows handling from the front, without contact between tool and slice, and it is the system based on the Bernouilli effect, whereby, by providing a suitable gripping tool (end effector), it is possible, by blowing filtered inert gas, towards the front of the slice, to create an attraction effect for the slice, which, in the horizontal position, is sufficient to overcome the weight of the slice, keeping it suspended.

However, accidental contact between the edges of the slices and some fixed points of the tool necessarily occurs because, in the absence of a support and hence friction, it is necessary to have some fixed points for fixing the slice underneath the gripping tool, although this fact is not particularly negative.

During unloading, in order to raise the slice from the cavity inside which it is seated, it is necessary to overcome, in addition to its own weight, also a slight vacuum which is formed between the cavity and the said slice. Since this is not possible by means of the Bernouilli effect alone, it is necessary to avoid the formation of this vacuum, for example by means of a network of tiny channels which are formed in the cavity underneath the slice. This technique is excellent, but is better suited for lamp-heated reactors, rather than induction-heated reactors, because the presence of non-conducting channels in the graphite mass of the susceptors would adversely affect the uniformity of heating of the slices. Moreover, this technique is not particularly compatible with reactors of the batch type because, although a flow of inert gas helps in keeping the front of the slice clean during handling, it is probably harmful for the adjacent slices, especially if handling takes place in the vicinity if the susceptor, because the flow of gas moves any dust particles which are present in movement.

Another system consists in handling the slices from the back, although there is the problem that the back of the slice is accessible when the latter is inside the cassette, but is no longer so when the slice is located on the susceptor. In order to overcome this drawback, it is possible to form throughholes in the susceptor and raise the slice, when required, by means of small supports, passing through the holes, which are able to move up to perform raising and move down to allow seating of the slice in the susceptor. In fact, during the loading cycle, the supports are raised and the slices rested on them. Then the supports are lowered and the slices are deposited in the corresponding seats on the susceptor. During the unloading cycle, the supports are raised, together with the slices; a tongue or gripping tool (end effector) made of suitable material is then introduced underneath the slice and the latter removed. If greater stability is required, it is possible to brake the slice by applying a slight vacuum between slice and gripping tool. However, this technique, although being effective, in practice can only be properly applied to reactors of the lamp-heated type, while it is probably unacceptable for induction-heated reactors because the holes formed in the graphite of the susceptor would result in a non-uniform current flow and hence heating.

Another known system is that which allows the slice to be gripped along its external diameter, or edge, at two or more points using movable gripping systems, such as mechanical grippers. However, this system cannot be easily realized, since it requires special machining of the cavity or the cavities of the susceptor which are not entirely compatible with the induction heating system. Finally, as already mentioned, any direct contact with the front of the slice is not permissible.

There exist, however, systems which are able to perform gripping of the slice from the front, limiting the contact to one or more areas on its external rim.

The slice is retained by a vacuum system by means of a chamber formed between slice and gripping tool. In this case, however, the raising force is limited to the surface area of contact with the external rim of the slice and an even slightest error in positioning between slice and gripping tool results, respectively, in a smaller or greater contact surface area with risks of lack of gripping of the slice or an increase in defects due to the direct contact between tool and slice. By way of conclusion, this system is not of an optimal nature owing to an excessively large contact surface area between tool and front of the slice.

The object of the present invention is that of providing an improved automatable device for supplying and removing semiconductor slices to/from an epitaxial reactor such as that described in the said International Patent Application WO 96/10659 which covers an epitaxial reactor provided with a flat disk-shaped susceptor and having a gas flow parallel to the substrates.

In short, operation of the reactor and the associated device comprises the following steps:

positioning racks or cassettes containing the slices to be grown inside the reactor, loading of the product, where the slices are transferred inside the reaction chamber, as described in greater detail below;

brief hydrogen purging inside the reaction chamber;

heating so as to bring the susceptor and the slices up to the appropriate temperature;

processing cycle as required by the relevant specification;

cooling to a temperature compatible with the unloading step; and unloading of the grown slices and transportation back into the cassettes, as described in greater detail below.

The loading and unloading steps are performed at temperatures which are compatible with the material forming the gripping tool.

Each growing cycle may be followed by other growing cycles or by a so-called etching cycle where the slices are not loaded and the following operations are performed:

brief purging by means of hydrogen in the reaction chamber;

heating so as to bring the susceptor up to the appropriate etching temperature;

etching cycle as required by the relevant specification; and cooling to a temperature compatible with loading of slices following the etching step.

The epitaxial reactor forming the subject of the abovementioned International Patent Applciation WO 96/10659 is of the so-called "pancake" type, namely with a disk-shaped susceptor which is induction-heated, so that none of the systems illustrated hereinabove may be effectively used.

In order to overcome the abovementioned drawbacks, a solution is used, comprising:

a first reactor zone, towards the so-called clean room, intended to receive the cassettes containing the slices to be processed and those already processed, where this part of the reactor may be in an air atmosphere or, alternatively, may envisage a chamber for purging with an inert gas, at least at the ambient temperature for the silicon of the slice to be processed (an inert gas, even low-cost such as nitrogen, may be preferable to air). Below the more simple case of an air atmosphere is described, where neither particularly efficient gas seals nor prolonged washing with inert gases is required. In the case where air is used, only a so-called absolute filter for the air is added in order to keep the air atmosphere as free as possible from solid particles (dust). Moreover, the same first zone of the reactor is provided with two doors which can be opened at any time, so as to allow the removal of the cassettes containing the slices, where opening of the doors does not require particularly long purging or washing cycles with inert gases. However, by way of alternative, should processing of the slices make unacceptable even the smallest defects due to local oxidation of the said slice, the first zone of the reactor may be provided with sealed doors and a system for purging, also by means of a pneumatic extraction pump, and introduction of inert gas, in order to minimize exposure of the slice to the air and consequently the said defects. A first robot, called external robot controlling handling of the slices, exists, the slices being handled from the back since the present cassettes which are commercially available are constructed precisely to allow this type of handling. A gripping tool of the external robot, which is also commercially available, transports the slices, keeping them pressed in position by means of a small vacuum source which is available in the robot.

The operating principle of the abovementioned solution is explained hereinbelow.

During loading, a slice is removed from the corresponding cassette and is positioned in an alignment and centring station which may also be constructed inside the said external robot. The cassettes, the alignment and centring station and the external robot are not novel and do not form part of the present invention.

Here the slice is oriented at the desired angle and the position of its geometric centre is calculated so as to allow subsequent precise gripping. The slice is then positioned inside the purging chamber on top of a quartz disk which acts as a support and is shaped so as to allow handling by means of the commercial gripping tool of the said external robot. The quartz disk has a relatively large mass compared to the slice so as to dissipate better its heat during unloading.

The access door is closed and the purging chamber is washed with an inert gas, in order to remove completely every trace of air, and, if necessary, washing may be aided by a vacuum extraction cycle in order to accelerate the said purging operation. At this point, the door providing access to the chamber where the internal robot according to the invention operates is opened, said chamber operating always in an inert-gas atmosphere and, except during maintenance operations, never being exposed to the air.

The gripping tool, or hand, of the internal robot forms part of the present invention, which invention allows the slices to be suitably handled by means of a very limited contact with their edges. In fact, each slice has a chamfered part or edge extending over about 1 mm. The part of the gripping tool in contact with the edge of the slice is shaped so as to limit the contact zone to the sole chamfer of the edge, extending over about 1 mm, and is made of suitable material, such as quartz. This part of the slice is not, however, useful in the manufacture of integrated circuits and therefore this solution is not damaging for the quality of the finished product. Moreover, the gripping tool, or hand, is connected to the arm of the internal robot by means of a structural pipe which has two functions:

the first is that of extending the robot arm so as to reach the position of the susceptor inside the reaction chamber;

the second is that of achieving, by means of an articulation or by exploiting the flexibility the arm, a certain degree of self-levelling between tool, or hand, and slice which is used during the operations involving raising of the said slice.

Raising of the slice is ensured by a certain vacuum which is obtained by a dedicated pneumatic machine. The vacuum is transferred to the slice by means of a series of holes which are distributed along the periphery of the gripping tool and are concentrated in the round zone of the slice and absent in a flat zone or recessed notch zone which is used for identification and orientation of each slice, where the flat zone is preferred for slices with a diameter of up to 150 mm, whereas in the case of larger-diameter slices the recessed notch zone is preferred. Since every irregularity in the shape of the slice causes a local reduction in the effects of the vacuum, according to the invention it is necessary to offset this reduction with a suitably calculated concentration of suction holes in the gripping tool.

During loading, the susceptor rotates and correctly positions, by means of reference systems known per se, the cavity to be loaded. This positioning may be performed by means of optical systems which are known per se. Then the slice is introduced into the reaction chamber and positioned above a suitable cavity of the susceptor. The internal robot moves downwards slightly, brings the slice into contact with the cavity and, when the vacuum is removed, releases the slice which is loaded onto the said cavity. The loading steps are repeated until all the cavities present on the susceptor are occupied. The scheduled processing of the slices is then started.

Out of all the optical systems it is possible to use a laser telemeter system which measures the distance between a laser emitter and the susceptor in question, producing an analog signal which is proportional to the said distance. For example, the laser telemeter helps eliminate defects in the parallel positioning of the susceptor by means of a scanning algorithm and subsequent correction by mechanical means which are known per se (for example micrometer screws). This parallel positioning is essential for ensuring uniformity of the epitaxial depositions onto the slices.

Once the scheduled processing of the slices has been completed, it is necessary to unload them from the susceptor. To do this, after waiting for the susceptor to reach a suitable temperature allowing extraction, without damage, of the slices from the reaction chamber, it is necessary to use again the said internal robot, which removes each slice from the corresponding cavity of the susceptor and transports it inside the purging chamber where it is placed onto the quartz disk which, with its large mass, cools it. After sufficient cooling, the slice is transferred by the external robot to a seat of one of the cassettes located in the first zone of the reactor.

The present invention which implements the methods described above consists in a device for handling substrates of materials produced in epitaxial apparatuses or reactors, such as slices of semiconductor materials, comprising:

a reaction chamber, an internal robot for handling the substrates or slices of semiconductor materials, a purging chamber for passing the slices through a cleaning atmosphere, a storage zone containing cassettes which house, in a stacked arrangement, the slices of semiconductor materials, an external robot for transferring the slices from the store to the purging chamber, the internal robot comprising a sealed chamber which houses an articulated arm having a gripping means at its external end, characterized in that the gripping means of the internal robot comprises at least one arm which can be inserted into the reaction chamber and terminating in a gripping tool or hand for removing a slice of semiconductor material from the purging chamber and transporting it, after passing through the sealed chamber, so as to be deposited in a recessed seat of a disk-shaped susceptor of the reaction chamber, and vice versa, from the recessed seat to the purging chamber, where the hand is designed to contact the slice on its uppermost surface along a peripheral zone or chamfered edge and the hand is adapted to grip the slice by means of a vacuum effect, and where the gripping means includes means for attaching it pivotally to the articulated arm in such a manner that when depositing the substrate in the recessed seat the substrate is held inclined to the plane of the recessed seat so as to touch the recessed seat initially only with the slice edge located farthest from the arm of the gripping means before then pivoting about said edge touching the seat to become fully in contact therewith, and vice versa, when transporting a slice from the reaction chamber to the purging chamber, the slice gripped by the hand's vacuum effect is detached from the recessed seat by first lifting the side of the slice nearest the arm of the gripping means and then detaching the substrate completely, and raising the substrate further whilst being held inclined to the plane of the recessed seat.

In particular the arm is tubular and hollow, being connected, on one side, by means of a flexible pipe to a vacuum source and, on the other side, to a circular seat formed inside the hand so as to apply a vacuum between a bottom side of the said hand and a slice present underneath the hand.

Preferably, articulation means are arranged between the hollow tubular arm and the articulated arm of the internal robot, said means allowing the hollow tubular arm to be raised and lowered so as to bring the hand above and below a plane defined by the articulated arm.

In addition, articulation means are arranged between the hollow tubular arm and the articulated arm of the internal robot, said means also allowing a rotation of the hollow tubular arm about its longitudinal axis.

Preferably, the articulation means comprise a support bearing which is fixed to the articulated arm and carries a rotating pin about which the articulation means rotate, and an adjusting screw for fixing the permitted heights for raising and lowering of the hand with respect to the plane of the articulated arm, so that the hand can rest in the radial direction on the disk-shaped susceptor only with the front part, only with the rear part or perfectly level with the said susceptor.

In addition, the articulation means also comprise, around the hollow tubular arm, anti-friction bushes for allowing alignment of the said hand, in a direction perpendicular to the radius of the disk-shaped susceptor.

Even more preferably, the hand is in the form of a disk with a diameter greater than the diameter of the slice to be handled and has a bottom part, facing the slice, provided with a recessed seat which engages only with an external peripheral rim of the said slice.

Preferably, the seat is present on a bottom part of the hand and is provided with a plurality of peripheral holes connected to a chamber inside the said hand which, in turn, is connected to the hollow tubular arm so as to apply a vacuum between the slice and the hand.

Most preferably, the peripheral holes are concentrated mainly where the greatest losses in vacuum are envisaged.

In a particular embodiment, a laser telemeter is used to measure a distance between a laser emitter and the disk-shaped susceptor of the reaction chamber, in question, producing an analogue signal proportional to the said distance, where said telemeter detects defects in the level arrangement of the susceptor as well as defects in the parallel positioning of the susceptor with respect to the reaction chamber.

Furthermore, a notch formed in the external rim of the susceptor is used as an angular reference point which can be detected by the laser telemeter and the recessed seats for the slices are counted starting from this notch.

According to the present invention, a method for placing a slice in a recessed seat of a disk-shaped susceptor, present in a reaction chamber, by means of a hand of a device, as defined above, is also provided, characterized in that a slice, which is made to adhere to the hand by means of a vacuum, enters into the reaction chamber in the raised position, is transported to above one of the recessed seats of the disk-shaped susceptor, is lowered so as to be placed onto the said seat, remaining inclined forwards so as to touch the recessed seat initially only with the slice edge located farthest from the arm of the gripping means and then with its whole surface, and then, after removal of the vacuum which keeps the slice attached to the hand, is further lowered, detaching the hand from the slice, and then the hand is raised again, being detached entirely from the slice, and finally is retracted, leaving the reaction chamber.

Alternatively, the method for removing a slice from a recessed seat of a disk-shaped susceptor, present in a reaction chamber, by means of a hand of a device, as defined above, is characterized in that the hand enters into the reaction chamber in the raised position, is transported to above a slice housed in one of the recessed seats of the disk-shaped susceptor, is lowered until it touches the slice, first at the edge located farthest from the arm of the gripping means and then over the entire circumference of the slice and then, after touching the slice over the entire circumference, applies a vacuum so as to cause the slice to adhere with its edge onto the hand and then starts to move up again, detaching the slice from the recessed seat, first at the edge located nearest the arm of the gripping means and then over the entire surface of the slice, and finally, after the slice has been raised completely from the recessed seat of the susceptor, transports it outside the reaction chamber.

The features of the present invention will be defined in the claims forming the conclusive part of the description thereof. However, other features and advantages will emerge from the following detailed description of an example of embodiment thereof, provided by way of a non-limiting example, in which:

FIG. 2 is a sectioned and truncated side view of a gripping tool, or hand, situated at the end of an extendable arm of the internal robot according to the present invention;

FIG. 3 is a sectioned and truncated plan view of the said gripping tool, or hand;

FIG. 4 is a partial, sectioned and enlarged view of the detail of the hand, encircled in FIG. 2, intended to show how the hand engages with the slice of semiconductor material to be transported;

FIGS. 5 to 8 are sectioned and truncated side views which show an approach sequence, towards a cavity of the susceptor, of the gripping means of the internal robot carrying a semiconductor slice so as to load the slice in the cavity of the susceptor;

Figure 1:
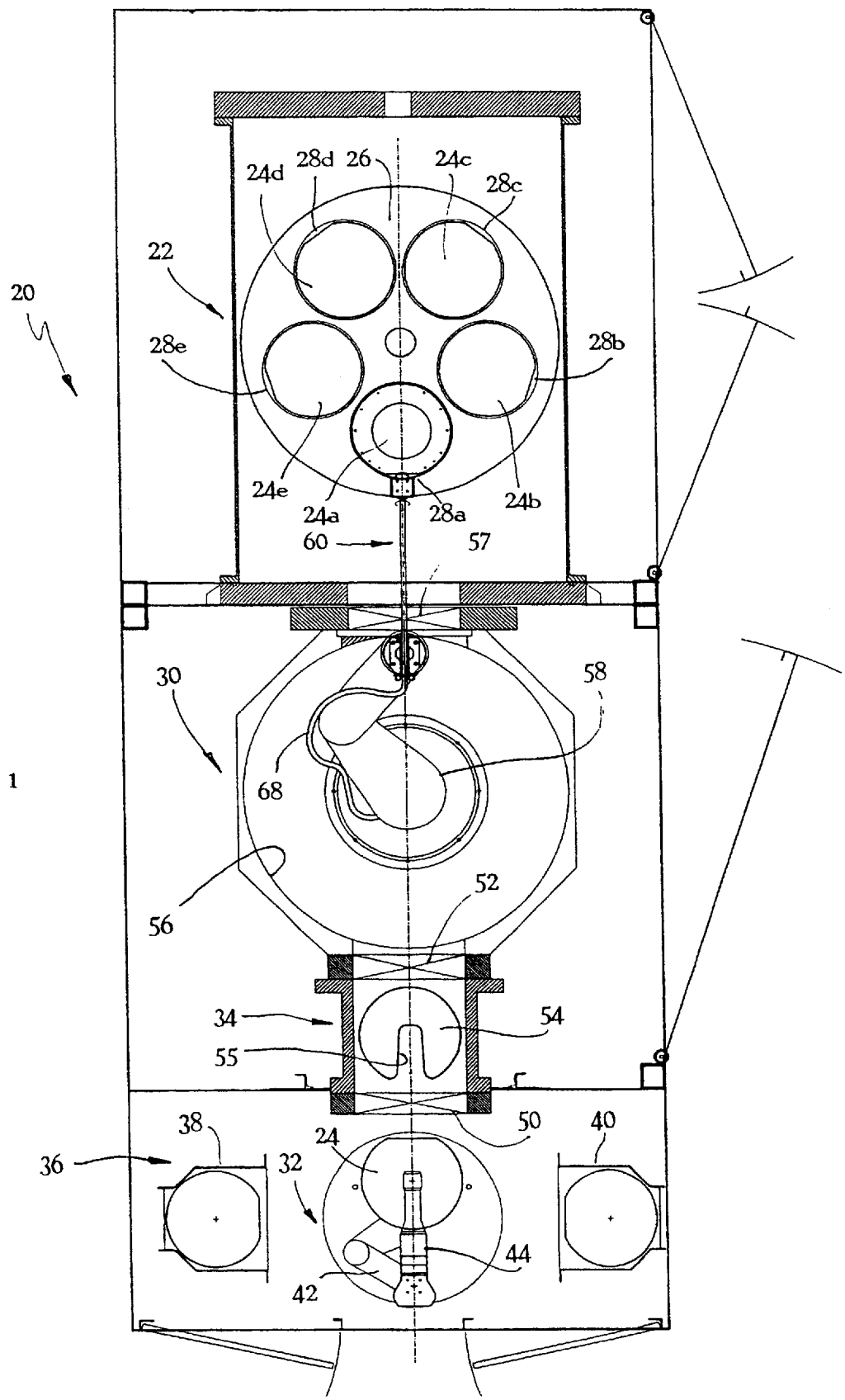
FIG. 1 is a sectioned plan view of a disk-shaped epitaxial reactor served by an external robot and an internal robot according to the invention.
Figure 9:
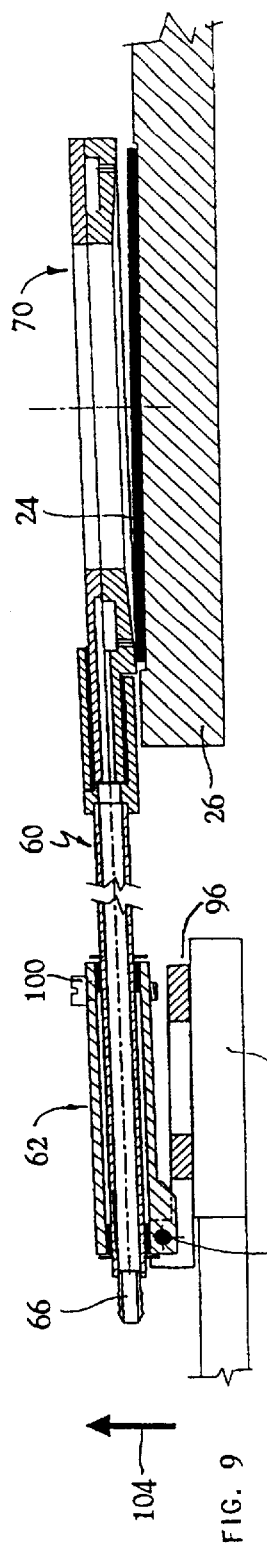
FIGS. 9 to 12 are sectioned and truncated side views which show a sequence where the gripping means is detached from the slice loaded in the cavity of the susceptor.

Let us consider first of all FIG. 1 which shows an epitaxial reactor 20 comprising a reaction chamber 22 served by several robots for placing and removing slices $24_{a-e}$ of semiconductor material onto/from a disk-shaped susceptor provided with cavities $28_{a-e}$ having dimensions for receiving the said slices $24_{a-e}$.

Since the slices $24_{a-e}$ must be placed in and removed from the cavities $28_{a-e}$ of the disk 26 present in the reaction chamber 22 without being manipulated manually, for this purpose a so-called internal robot 30 has been provided, said robot 30 comprising a tubular arm 64 terminating in a gripping tool or hand 70, forming the subject of the invention, and a so-called external robot 32. The internal robot 30 remains localized between the reaction chamber 22 and a purging chamber 34 having the function of processing slices $24_{a-e}$ passing between a first zone or storage zone 36 for slices and the internal robot 30 and, vice versa, from the internal robot 30 to the first storage zone 36.

The storage zone 36 is provided with two cassettes 38 and 40 which have the function of containing slices of semiconductor material which are to undergo processing in the reaction chamber 22 or containing the slices of semiconductor material which have undergone processing in the reaction chamber 22. Moreover the storage zone 36 contains an articulated arm 42 terminating in a gripping means 44 of the vacuum type which has the function of ensuring transportation of slices 24 from the cassette 38 to the purging chamber 34 and, vice versa, from the purging chamber 34 to the cassette 40. The articulated arm 42 is already known per se.

The purging chamber 34 comprises a first hermetically sealed door 50 of the rapid-action type, such as a guillotine door, a second hermetically sealed door 52, of the same type as the door 50, and a disk 54 for supporting the slices 24 passing through into the said purging chamber 34. Preferably, the disk 54 is made of quartz so as to ensure good wear-resistance and substantially zero contamination and is provided with a recess 55 for receiving the gripping means 44 when it enters into the purging chamber 34 in order to deposit or remove a slice 24. The disk 54 has a relatively large mass, compared to the slice, in order to dissipate better its heat during the cooling stage. The purging chamber 34 has the function of preparing the slices 24 to pass from the substantially dust-free atmosphere of the storage zone 36, which may be air or another simple inert gas, such as nitrogen, to that of the reaction chamber 22, which consists mainly of hydrogen, and vice versa, from the atmosphere of the reaction chamber 22 consisting essentially of hydrogen to that of the storage zone 26, since it is desirable to avoid introducing gases which react with hydrogen into the reaction chamber and releasing into the atmosphere the hydrogen and gases which are formed in the reaction chamber during the CVD operations and which may be poisonous or an irritant, such as HClI for example.

The internal robot 30 is contained in a sealed chamber 56 provided, in addition to the hermetically sealed door 52 communicating with the purging chamber 34, also with another hermetically sealed door 57 communicating with the reaction chamber 22 and comprises an articulated arm 58 which has at its external end a gripping and transportation means 60, which will be described in greater detail in FIGS. 2 to 4 and which has the function of transporting the slices 24 from the purging chamber 34 to the reaction chamber 22 and vice versa.

If we consider FIGS. 2 to 4, it can be seen that a gripping and transportation means 60 according to the present invention consists of articulation means 62, which are connected to the articulated arm 58, a tubular arm 64 provided with a connection piece 66 for connection to a flexible pipe 68 (visible in FIG. 1) which, in turn, is connected to a pneumatic machine (not shown) as a vacuum source. The tubular arm 64 is connected, at its end remote from the articulation means 62, to a gripping tool or "hand" 70 which has the function of retaining a slice 24 during its transportation from the slice support disk 54 present in the purging chamber 34 to the disk-shaped susceptor 26 and, vice versa, from the susceptor 26 to the support disk 24.

The hand 70 is formed by two components 72 and 74 in the shape of a circular rim and bonded together. The top component 72 is provided with a tail-piece 76 for securing to a clamp 78 connected to the tubular arm 64 and forms, together with a tail-piece 80 of the bottom component 74, a duct 82 communicating with the tubular arm 64. The bottom component 74 is provided with a circular cavity 84 communicating with the duct 82 and with small holes $86_{a-m}$ passing through its side directed towards the slice 24. Moreover, this bottom component 74 enters into contact only with a limited edge portion 25 of the slice 24 which is envisaged as having no useful function for the processing to be performed on the slice.

Let us now consider FIGS. 5 to 8 which depict the procedure with which the gripping means 60 deposit a semiconductor slice 24 inside a cavity 28 of the susceptor disk 26. As has been amply depicted in FIGS. 2 and 3, the gripping means 60 is formed by a hand 70 which is connected by means of the tubular arm 64 and the connection piece 66 to a flexible pipe 68 communicating, upon actuation, with a vacuum source.

As shown in FIG. 5, the gripping means 60 enters into the reaction chamber 72, transporting a semiconductor slice 24 adhering to the hand 70, where adhesion of the slice 24 to the hand 70 is ensured by the vacuum (symbolically shown by an arrow 90) applied to the connection piece 66. Entry into the reaction chamber 22 is symbolically shown by a first bold arrow 92 which indicates a forwards movement of the articulated arm 58. Then the gripping means 60 starts to move downwards towards the disk-shaped susceptor 26, as symbolically shown by a second bold arrow 94 which indicates a downward movement of the said articulated arm 58.

For as long as the articulated arm 58 is raised such that the slice 24 held by the hand 70 does not touch the cavity 28 on the disk-shaped susceptor 26, the weight of the hand 70 and the slice 24 causes the articulation means 62 to rest on a pad 96 present at the end of the arm 58, rotating about a pivot pin 98 and descending as far as a point permitted by an adjusting screw 100. When the arm 58 moves downwards to the point where the end of the slice 24 touches the cavity 28 located towards the inside of the susceptor 26, as can be seen in FIG. 6, the downward movement of the hand 70 stops and the gripping means 60 is oriented increasingly parallel to the susceptor 26 with the start of raising of the screw 100 until, as can be seen in FIG. 7, the slice 24 rests totally on the cavity 28. At this point the vacuum, represented by the arrow 90, is removed, causing the slice 24 to be detached from the hand 70. In the meantime, before the slice 24 has become detached from the hand 70, two bushes 63 and 65 made of anti-friction material, such as ceramic material or Teflon®, allow rotation of the tubular arm 64 in the direction of a circular arrow 67, indicated in FIG. 3, so as to allow complete levelling of the slice 24 inside the cavity 28, thereby providing the gripping and transportation means 60 with the self-levelling feature which forms part of this invention. Once the slice 24 is fully supported by and level inside the cavity 28 and the absence of the vacuum 90 has caused separation of the hand 70 from the said slice, a further downward movement of the articulated arm 58 results in raising of the hand 70 from the inner side of the slice 24, as can be seen in FIG. 8.

Figure 10:
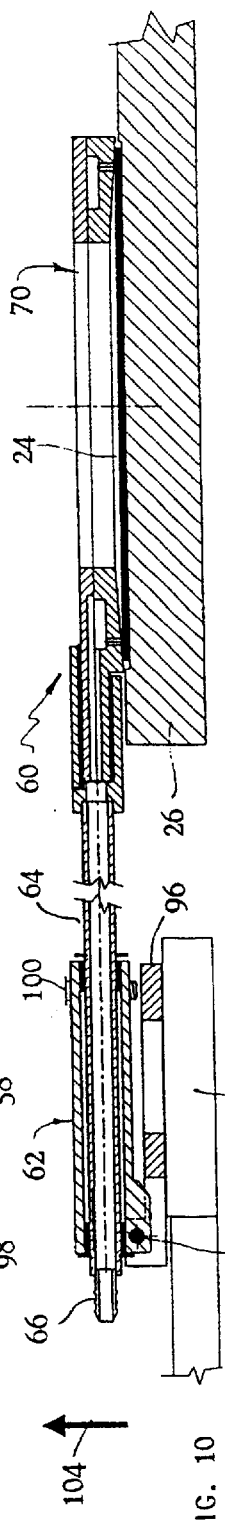

If we now examine FIGS. 9 to 12, it can be seen how the hand 70 may be detached from the slice 24, releasing it entirely inside the cavity 28 of the susceptor 26. In fact, in FIG. 9 it can be seen that, while the said absence of vacuum 90 keeps the hand 70 substantially detached from the slice 24, the arm 58 starts to move upwards in the direction of the bold arrow 104 until the hand 70 rests fully on the slice 24, as can be seen in FIG. 10, while remaining detached from the slice on account of the absence of vacuum 90 applied to the hand.

Figure 11:
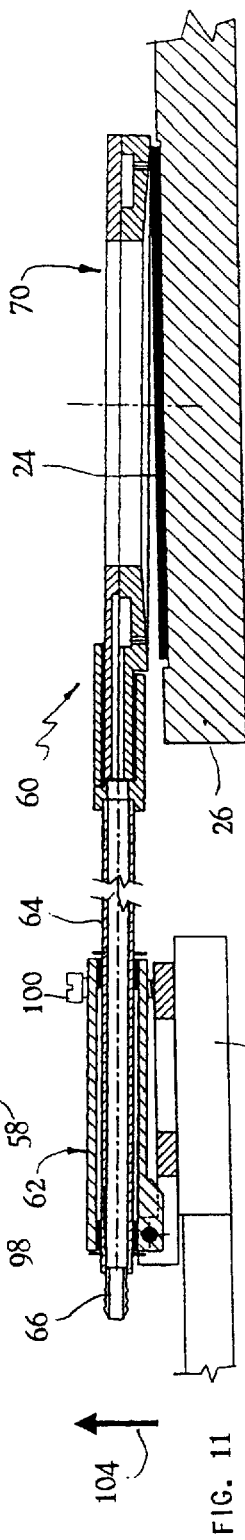
Figure 12:
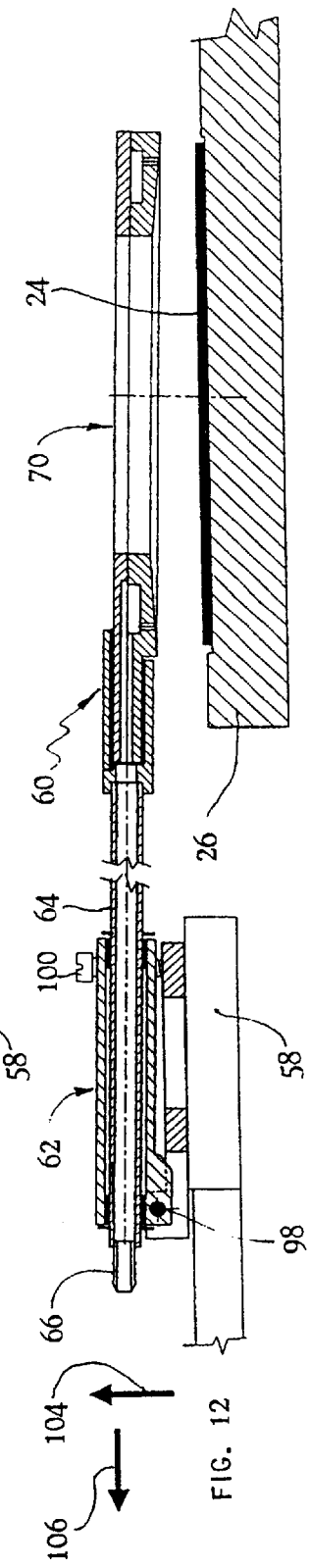
Figure 13:
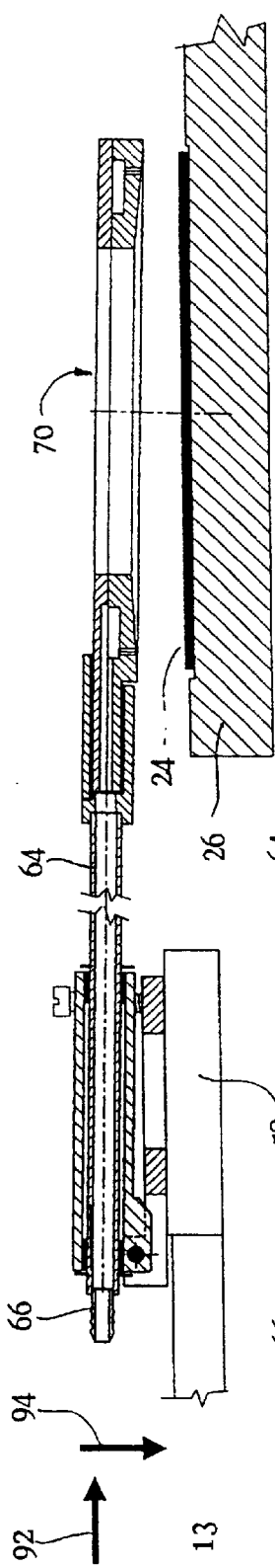
FIGS. 13 to 16 are sectioned and truncated side views which show an approach sequence of the gripping means of the robot towards a semiconductor slice present in a cavity of the susceptor, in order to remove the said slice.

Subsequent raising of the articulated arm 58 in the direction of the arrow 104 causes raising of the hand 70 on the outer side, as can be seen in FIG. 11.

Finally, further raising of the arm 58 completely detaches and raises the hand 70 from the slice 24 and a retracting movement of the arm 58 in the direction of the arrow 106 brings the gripping and transportation means 60 outside of the reaction chamber 22 (see FIG. 1).

FIGS. 13 to 16 depict the procedure with which the gripping means 60 cause positioning of a hand 70 on a slice 24 seated in a cavity of the susceptor 26 and FIGS. 17 to 20 depict raising and removal of the slice 24 from the cavity 28 of the susceptor 26.

Figure 14:
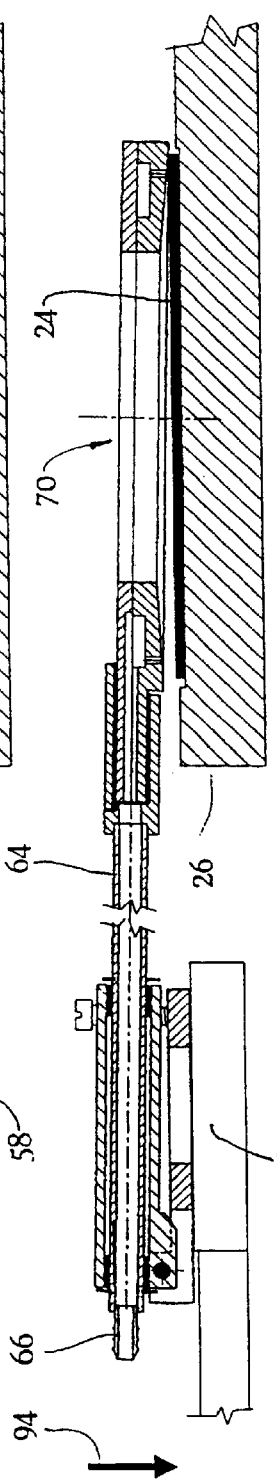
Figure 15:
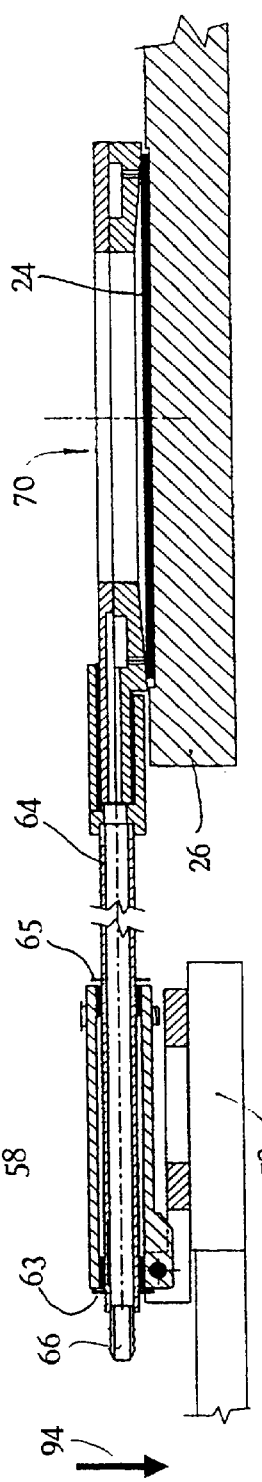
Figure 16:
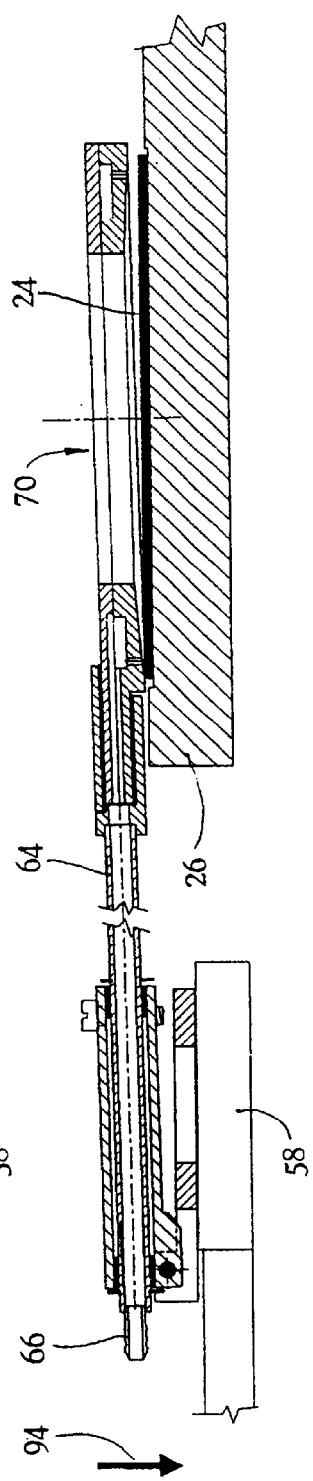

With reference in particular to FIGS. 13 to 16, it can be seen that the articulated arm 58, with the forwards movement indicated by the arrow 92, brings the hand 70 into alignment with the slice 24, whereas, with the lowering movement indicated by the arrow 94, it causes the hand to move towards the slice. As can be seen in FIG. 14, further lowering of the arm 58 brings the hand 70 into contact first with the inner side of the slice 24 and finally, as can be seen in FIG. 15, into contact with the whole slice 24. The bushes 63 and 65, by allowing a rotation about the axis of the tubular arm 64, also allow complete self-alignment of the hand 70 with the slice 24. The arm 58 may move downwards a little further, as depicted in FIG. 16, causing a certain detachment of the hand 70 from the inner side of the slice 24, but this is of no significance.

Figure 17:
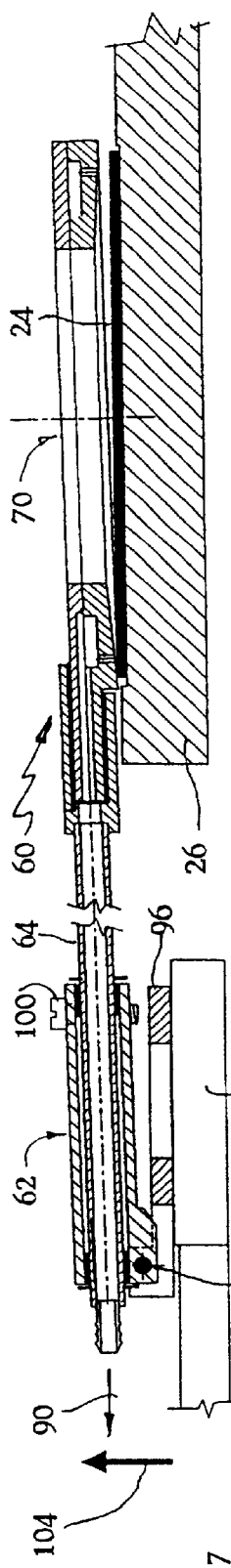
FIGS. 17 to 20 are sectioned and truncated side views which show a sequence where the semiconductor slice is detached and removed from the cavity of the susceptor.
Figure 18:
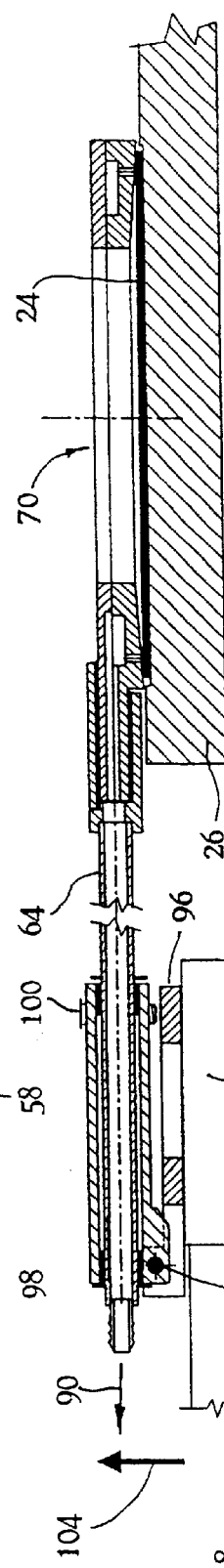

With reference to FIG. 17, it can be seen how the articulated arm 58 starts to move upwards again, as indicated by the arrow 104, while a vacuum indicated by the arrow 90 is applied to the tubular arm 64, causing first the outer side of the slice 24 to adhere to the hand 70. Then, as indicated in FIG. 18, further raising of the articulated arm 58 causes the hand 70 to adhere completely to the slice 24, while the vacuum 90 attaches the slice 24 to the hand 70.

Figure 19:
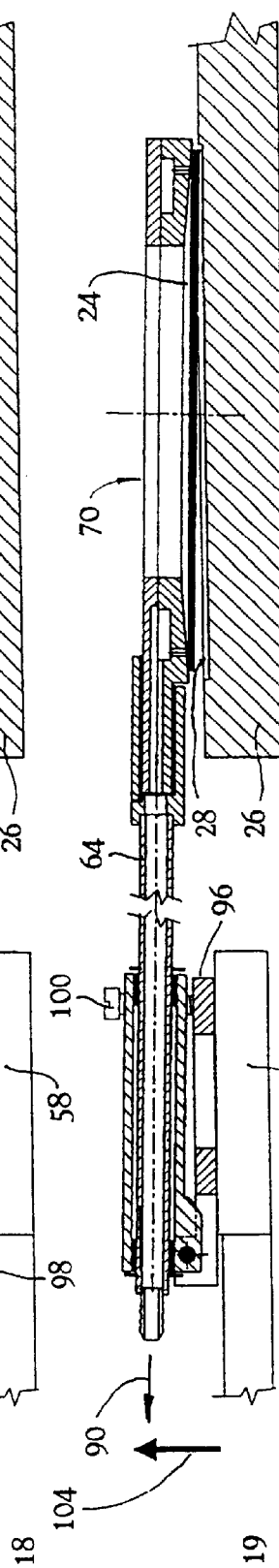
Figure 20:
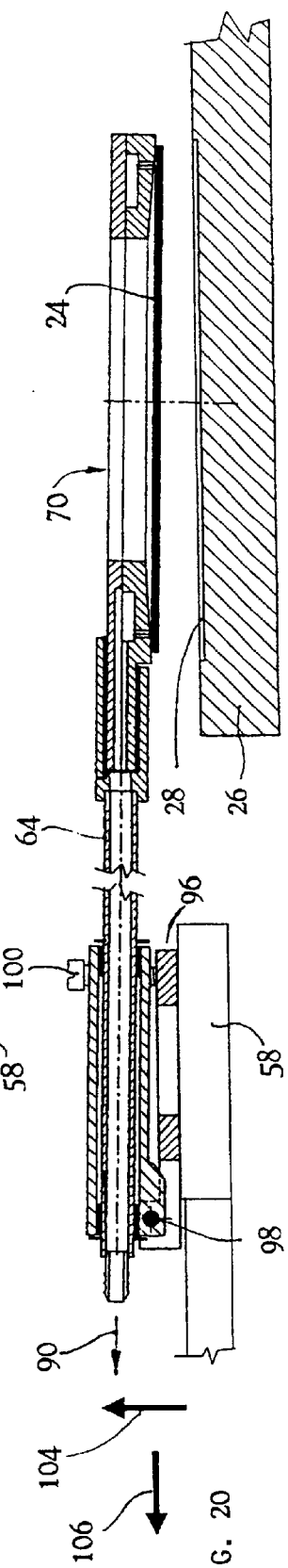

Subsequent further raising of the arm 58 causes rotation of the articulation means 62 about their pivot pin 98 until the screw 100 rests on the pad 96, causing the outer side of the slice 24 to be detached from the cavity 28 of the susceptor 26, as can be seen in FIG. 19, thereby avoiding any forced separation of the slice 24 from the cavity 28, as could happen if it were attempted to detach the slice 24 keeping it parallel to the cavity 28. This avoids possible damage to the slice 24 due to excessive forces applied by the hand 70 and possible vibrations of the said tubular arm 64 due to a sudden release of the slice 24 from the cavity 28. Finally, as can be seen in FIG. 20, final raising of the arm 58 in the direction of the arrow 104 completely detaches the slice 24 from the cavity 28, while a retracting movement of the arm 28 in the direction of the arrow 106 brings the hand 70 together with the slice 24 outside of the reaction chamber 22 (see FIG. 1).

It should be noted that, in order to avoid excessive deformations resulting from warping of the slices 24 and/or offset small errors in alignment when the said slices are transported by the hand 70, means are provided for adjusting the vacuum applied by the said hand 70. In particular, the vacuum must be kept at a maximum value while the hand 70 starts to engage with the slices 24, but is then adjusted to a preset value when engagement of the hand 70 with the slices 24 has been completed.

The above description illustrates an example of embodiment of the invention which is not to be regarded in any way as limiting the invention, the covering scope of which will be defined only by the accompanying claims. Therefore all those logically equivalent solutions which may occur to a person skilled in the art following reading of the abovementioned description must be regarded as being covered herein.

What is claimed is:

1. Device for handling substrates of materials produced in epitaxial apparatuses or reactors such as slices of semiconductor materials, comprising:
    a reaction chamber (22),
    an internal robot (30) for handling the substrates or slices (24) of semiconductor materials,
    a purging chamber (34) for passing the slices (24) through a cleaning atmosphere,
    a storage zone (36) containing cassettes (38, 40) which house, in a stacked arrangement, the slices (24) of semiconductor materials,
    an external robot (32) for transferring the slices (24) from the storage zone (36) to the purging chamber (34),
    the internal robot (30) comprising a sealed chamber (56) which houses an articulated arm (58) having a gripping means (60) at its external end, characterized in that the gripping means (60) of the internal robot (30) comprises at least one arm (64) which can be inserted into the reaction chamber (22) and terminating in a gripping tool or hand (70) for removing a slice (24) of semiconductor material from the purging chamber (34) and transporting it, after passing through the sealed chamber (56), so as to be deposited in a recessed seat (28) of a disk-shaped susceptor (26) of the reaction chamber (22), and vice versa, from the recessed seat (28) to the purging chamber (34), where the hand (70) is designed to contact the slice (24) on its uppermost surface along a peripheral zone or chamfered edge (25) and the hand is adapted to grip the slice (24) by means of a vacuum effect, and where the gripping means (60) includes means for attaching it pivotally to the articulated arm (58) in such a manner that when depositing the substrate in the recessed seat (28) the substrate is held inclined to the plane of the recessed seat (28) so as to touch the recessed seat (28) initially only with the slice edge located furthest from the arm (64) of the gripping means (60) before then pivoting about said edge touching the seat to become fully in contact therewith, and vice versa, when transporting a slice (24) from the reaction chamber (22) to the purging chamber (34), the slice gripped by the hand's vacuum effect is detached from the recessed seat (28) by first lifting the side of the slice nearest the arm (64) of the gripping means (60) and then detaching the substrate completely, and raising the substrate further whilst being held inclined to the plane of the recessed seat.

2. Device for handling substrates according to claim 1, characterized in that the arm (64) is tubular and hollow, being connected, on one side, by means of a flexible pipe (68) to a vacuum source and, on the other side, to a circular seat (84) formed inside the hand (70) so as to apply a vacuum between a bottom side of the said band (70) and a slice (24) present underneath the hand (70).

3. Device for handling substrates according to claim 2, characterized in that articulation means (62) are arranged between the hollow tubular arm (64) and the articulated arm (58) of the internal robot (30), said means allowing the hollow tubular arm (64) to be raised and lowered so as to bring the hand (70) above and below a plane defined by the articulated arm (58).

4. Device for handling substrates according to claim 3, characterized in that articulation means (62) are arranged between the hollow tubular arm (64) and the articulated arm (58) of the internal robot (30), said means also allowing a rotation of the hollow tubular arm (64) about its longitudinal axis.

5. Device for handling substrates according to claim 4, characterized in that the articulation means (62) comprise a support bearing (96) which is fixed to the articulated arm (58) and carries a rotating pin (98) about which the articulation means (62) rotate, and an adjusting screw (100) for fixing the permitted heights for raising and lowering of the hand (70) with respect to the plane of the articulated arm (58), so that the hand can rest in the radial direction on the disk-shaped susceptor (26) only with the front part, only with the rear part or perfectly level with the said susceptor (26).

6. Device for handling substrates according to claim 5, characterized in that the articulation means (62) also comprise, around the hollow tubular arm (64), anti-fiction bushes (63, 65) for allowing alignment of the said hand (70), in a direction perpendicular to the radius of the disk-shaped susceptor (26).

7. Device for handling substrates according to claim 6, characterized in that the hand (70) is in the form of a disk with a diameter greater than the diameter of the slice (24) to be handled and has a bottom part (74), facing the slice (24), provided with a recessed seat which engages only with an external peripheral rim (25) of the said slice (24).

8. Device for handling substrates according to claim 7, characterized in that the seat is present on a bottom part (74) of the hand (70) and is provided with a plurality of peripheral holes (86) connected to a chamber (84) inside the said hand (70) which, in turn, is connected to the hollow tubular arm (64) so as to apply a vacuum between the slice (24) and the hand (70).

9. Device for handling substrates according to claim 8, characterized in that the peripheral holes (86) are concentrated mainly where the greatest losses in vacuum are envisaged.

10. Device for handling substrates as recited in any one of claims 1–9, characterized in that a laser telemeter is used to measure a distance between a laser emitter and the disk-shaped susceptor (26) of the reaction chamber (22), in question, producing an analogue signal proportional to the said distance, where said telemeter detects defects in the level arrangement of the susceptor (26) as well as defects in the parallel positioning of the susceptor (26) with respect to the reaction chamber (22).

11. Device for handling substrates according to claim 10, characterized in that a notch formed in the external rim of the susceptor (26) is used as an angular reference point which can be detected by the laser telemeter and the recessed seats (28) for the slices (24) are counted starting from this notch.

12. Method for placing a slice (24) in a recessed seat (28) of a disk-shaped susceptor (26), present in a reaction chamber (22), by means of a hand (70) of a device according to any one of claims 1–9, characterized in that a slice (24), which is made to adhere to the hand (70) by means of a vacuum, enters into the reaction chamber (22) in the raised position, is transported to above one of the recessed seats (28) of the disk-shaped susceptor (26), is lowered so as to be placed onto the said seat (28), remaining inclined forwards so as to touch the recessed seat (28) initially only with the slice edge located farthest from the arm (64) of the gripping means (60), and then, after removal of the vacuum which keeps the slice (24) attached to the hand (70), is further lowered, detaching the hand (70) from the slice (24), and then the hand (70) is raised again, being detached entirely from the slice (24), and finally is retracted, leaving the reaction chamber (22).

13. Method for removing a slice (24) from a recessed seat (28) of a disk-shaped susceptor (26), present in a reaction chamber (22), by means of a hand (70) of a device according to any one of claims 1–9, characterized in that the hand (70) enters into the reaction chamber (22) in the raised position, is transported to above a slice (24) housed in one of the recessed seats (28) of the disk-shaped susceptor (26), is lowered until it touches the slice (24), first at the edge located farthest from the arm (64) of the gripping means (60) and then over the entire circumference of the slice (24) and then, after touching the slice over the entire circumference, applies a vacuum so as to cause the slice (24) to adhere with its edge (25) onto the hand (70) and then starts to move up again; detaching the slice (24) from the recessed seat (28), first at the edge located nearest the arm (64) of the gripping means (60) and then over the entire surface of the slice (24), and finally, after the slice (24) has been raised completely from the recessed seat (28) of the susceptor (26), transports it outside the reaction chamber (22).

14. Method according to claim 13, characterized in that, in order to avoid excessive deformations of the slices (24) due to warping, a vacuum is applied to the hand (70), said vacuum being at a maximum at the start of engagement of the slices (24) by the said hand (70), when the slices (24) are not fully in contact with the hand (70), but subsequently means for adjusting the vacuum reduce the said vacuum to a minimum value sufficient to maintain adhesion between slices (24) and hand (70) without causing substantial deformation of the slices (24).

15. The method according to claim 12, characterized in that, in order to avoid excessive deformations of the slices (24) due to warping, a vacuum is applied to the hand (70), said vacuum being at a maximum at the start of engagement of the slices (24) by the said band (70), when the slices (24) are not fully in contact with the band (70), but subsequently means for adjusting the vacuum reduce the said vacuum to a minimum value sufficient to maintain adhesion between slices (24) and hand (70) without causing substantial deformation of the slices (24).

\* \* \* \* \*